(12) United States Patent
Smith

(10) Patent No.: US 10,020,228 B2
(45) Date of Patent: *Jul. 10, 2018

(54) INTEGRATED CIRCUITRY AND METHODS OF FORMING TRANSISTORS

(71) Applicant: Micron Technology, Inc., Boise, ID (US)

(72) Inventor: Michael A. Smith, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/357,602

(22) Filed: Nov. 21, 2016

(65) Prior Publication Data

US 2017/0069538 A1 Mar. 9, 2017

Related U.S. Application Data

(60) Division of application No. 14/966,927, filed on Dec. 11, 2015, now Pat. No. 9,530,837, which is a
(Continued)

(51) Int. Cl.
*H01L 21/8234* (2006.01)
*H01L 27/092* (2006.01)
(Continued)

(52) U.S. Cl.
CPC .... *H01L 21/823418* (2013.01); *H01L 21/265* (2013.01); *H01L 21/26513* (2013.01); *H01L 21/82385* (2013.01); *H01L 21/823412* (2013.01); *H01L 21/823456* (2013.01); *H01L 27/0207* (2013.01); *H01L 27/0617* (2013.01); *H01L 27/085* (2013.01); *H01L 27/088* (2013.01); *H01L 27/092* (2013.01); *H01L 27/0922* (2013.01); *H01L 27/11526* (2013.01); *H01L 27/11529* (2013.01); *H01L 27/11573* (2013.01); *H01L 29/063* (2013.01);
(Continued)

(58) Field of Classification Search
CPC ....... H01L 21/823456; H01L 21/82385; H01L 27/0922; H01L 27/088
See application file for complete search history.

(56) References Cited

U.S. PATENT DOCUMENTS 7,323,740 B2 1/2008 Park et al.
8,076,208 B2 12/2011 Smith
(Continued)

*Primary Examiner* — Phat X Cao
(74) *Attorney, Agent, or Firm* — Wells St. John P.S.

(57) ABSTRACT

Some embodiments include integrated circuits having first and second transistors. The first transistor is wider than the second transistor. The first and second transistors have first and second active regions, respectively. Dielectric features are associated with the first active region and break up the first active region. The second active region is not broken up to the same extent as the first active region. Some embodiments include methods of forming transistors. Active areas of first and second transistors are formed. The active area of the first transistor is wider than the active area of the second transistor. Dielectric features are formed in the active area of the first transistor. The active area of the first transistor is broken up to a different extent than the active area of the second transistor. The active areas of the first and second transistors are simultaneously doped.

16 Claims, 9 Drawing Sheets

Related U.S. Application Data continuation of application No. 14/702,571, filed on May 1, 2015, now Pat. No. 9,236,307, which is a division of application No. 13/897,047, filed on May 17, 2013, now Pat. No. 9,041,144.

(51) Int. Cl.

| | |
|---|---|
| H01L 27/088 | (2006.01) |
| H01L 27/085 | (2006.01) |
| H01L 27/06 | (2006.01) |
| H01L 29/78 | (2006.01) |
| H01L 21/265 | (2006.01) |
| H01L 29/66 | (2006.01) |
| H01L 27/02 | (2006.01) |
| H01L 29/06 | (2006.01) |
| H01L 21/8238 | (2006.01) |
| H01L 27/11526 | (2017.01) |
| H01L 27/11573 | (2017.01) |
| H01L 29/08 | (2006.01) |
| H01L 29/788 | (2006.01) |
| H01L 29/792 | (2006.01) |
| H01L 27/11529 | (2017.01) |
| H01L 27/11531 | (2017.01) |

(52) U.S. Cl.
CPC ...... *H01L 29/0653* (2013.01); *H01L 29/0873* (2013.01); *H01L 29/66575* (2013.01); *H01L 29/66659* (2013.01); *H01L 29/66825* (2013.01); *H01L 29/66833* (2013.01); *H01L 29/788* (2013.01); *H01L 29/7833* (2013.01); *H01L 29/7835* (2013.01); *H01L 29/792* (2013.01); *H01L 27/11531* (2013.01)

(56) References Cited

U.S. PATENT DOCUMENTS

| | | |
|---|---|---|
| 8,236,640 B2 | 8/2012 | Smith |
| 8,243,526 B2 | 8/2012 | Smith et al. |
| 9,041,144 B2 | 5/2015 | Smith |
| 9,236,307 B2 * | 1/2016 | Smith .................. H01L 27/092 |
| 2004/0152273 A1 | 8/2004 | Kim |
| 2006/0138568 A1 | 6/2006 | Taniguchi et al. |
| 2009/0072319 A1 | 3/2009 | Sonsky et al. |
| 2009/0159968 A1 | 6/2009 | Merchant |
| 2009/0278208 A1 * | 11/2009 | Chang ............... H01L 21/76229 257/392 |
| 2010/0090278 A1 | 4/2010 | Rohrer |
| 2010/0096697 A1 | 4/2010 | Su et al. |
| 2010/0140699 A1 | 6/2010 | Ko |
| 2011/0127602 A1 | 6/2011 | Mallikarjunaswamy |
| 2011/0140204 A1 | 6/2011 | Smith et al. |
| 2011/0156144 A1 | 6/2011 | Benaissa |
| 2012/0043608 A1 | 2/2012 | Yang et al. |
| 2012/0267716 A1 | 10/2012 | Kao et al. |
| 2013/0187227 A1 | 7/2013 | Nandakumar |

* cited by examiner

INTEGRATED CIRCUITRY AND METHODS OF FORMING TRANSISTORS

RELATED PATENT DATA

This patent resulted from a divisional of U.S. patent application Ser. No. 14/966,927, which was filed Dec. 11, 2015, which resulted from a continuation of U.S. patent application Ser. No. 14/702,571, which was filed May 1, 2015, which issued as U.S. Pat. No. 9,236,307, and which is hereby incorporated herein by reference; which resulted from a divisional of U.S. patent application Ser. No. 13/897,047, which was filed May 17, 2013, which issued as U.S. Pat. No. 9,041,144 and which is hereby incorporated herein by reference.

TECHNICAL FIELD

Integrated circuitry and methods of forming transistors.

BACKGROUND

Transistors, such as field effect transistors (FETs), having high breakdown voltages (e.g., above about 15 volts, and in some applications to about 80 volts or greater) are used in various integrated circuit applications. Transistors having high breakdown voltages may be referred to as high-voltage transistors, meaning that the transistors are configured to tolerate high voltages (e.g., above 15 volts).

One technique for creating a high-voltage transistor uses a lightly-doped diffusion region (LDD region) between the drain and gate of the transistor. This region is an active area of the transistor, and is sometimes referred to as a drain extension region. One class of devices utilizing LDD regions are Reduced Surface Field Devices (RESURF) devices.

High-voltage transistors may be configured with different drive currents. For instance, wide transistors may have higher drive currents than narrow transistors.

The active area of a high-voltage transistor is doped to form the LDD region, and there will be an optimum doping that will achieve a desired breakdown characteristic. Transistors having different drive currents may have different optimum doping concentrations relative to one another (e.g., wider transistors may have a different optimum doping concentration than narrower transistors), which can be problematic during fabrication of the transistors. Specifically, it can be problematic to utilize multiple doping steps during fabrication of high-voltage transistors in that multiple doping steps add process steps and thus may increase fabrication costs as compared to a single doping step. It would be desirable to develop alternative transistor structures, and methods of their formation, which enable a single doping step to appropriately dope multiple high-voltage transistors having different drive currents.

DETAILED DESCRIPTION OF THE ILLUSTRATED EMBODIMENTS

Some embodiments include methods for altering the optimum LDD implant dose of a high-voltage transistor while substantially maintaining the drive current of the transistor. Such methods may be utilized during fabrication of multiple high-voltage transistors of different widths so that a common LDD implant may be utilized for forming active regions of all of the high-voltage transistors. In some embodiments, a method for altering the optimum LDD implant dose of a high-voltage transistor comprises breaking up an active region of the transistor with a plurality of dielectric features. Example embodiments are described below with reference to FIGS. 1-13.

Figure 1:
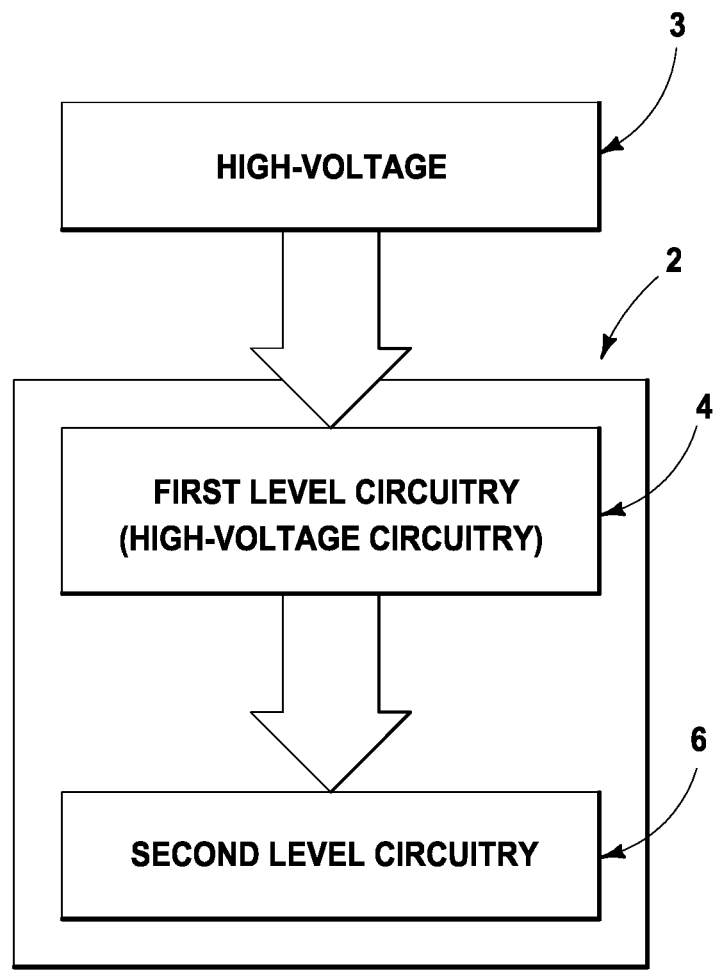
FIG. 1 is a diagrammatic view of circuitry that may be on an integrated circuit chip, and of circuitry that may be coupled with the circuitry on the chip, in an example embodiment.

Referring to FIG. 1, an example embodiment integrated circuit chip 2 is illustrated to show an example application of high-voltage circuitry. Specifically, a high-voltage source 3 provides power to the chip. The high-voltage source is diagrammatically illustrated to be external of the chip, and may be electrically connected to the chip through any suitable arrangement, such as, for example, wires, pins, etc. Although the high-voltage source is shown external of the chip, it is to be understood that in some applications the source may be on the chip itself; and in such applications the high voltage source may comprise pump circuitry utilizing high voltage transistors.

The integrated circuit chip 2 comprises a first level of circuitry 4 which is directly electrically coupled to the high-voltage source. Such first level of circuitry comprises high-voltage circuitry, such as, for example, high-voltage transistors. The high-voltage transistors may have high breakdown voltages (for instance, about 15 volts or greater) in order to tolerate the high voltages that such transistors may be exposed to.

The integrated circuit chip 2 comprises a second level of circuitry 6 which is coupled to the first level of circuitry 4. The second level of circuitry may be memory circuitry, logic circuitry, etc., and the first level of circuitry may be utilized to transform the power characteristics of the high-voltage source into characteristics suitable for driving and/or otherwise operating the second level of circuitry. For instance, in some applications the second level of circuitry may comprise flash memory (for instance, NAND memory) and the first level of circuitry may be utilized to provide power for a block erase of the flash memory and/or for reading and programming of the memory.

It can be desired that the first level of circuitry comprise numerous high-voltage transistors, with some of the transistors having higher drive currents than others (for instance, with some of the transistors being wider than others). As discussed above in the "Background" section of this disclosure, it can be difficult to fabricate multiple high-voltage transistors of differing drive currents due to the different LDD doses that may be required.

Figure 2:
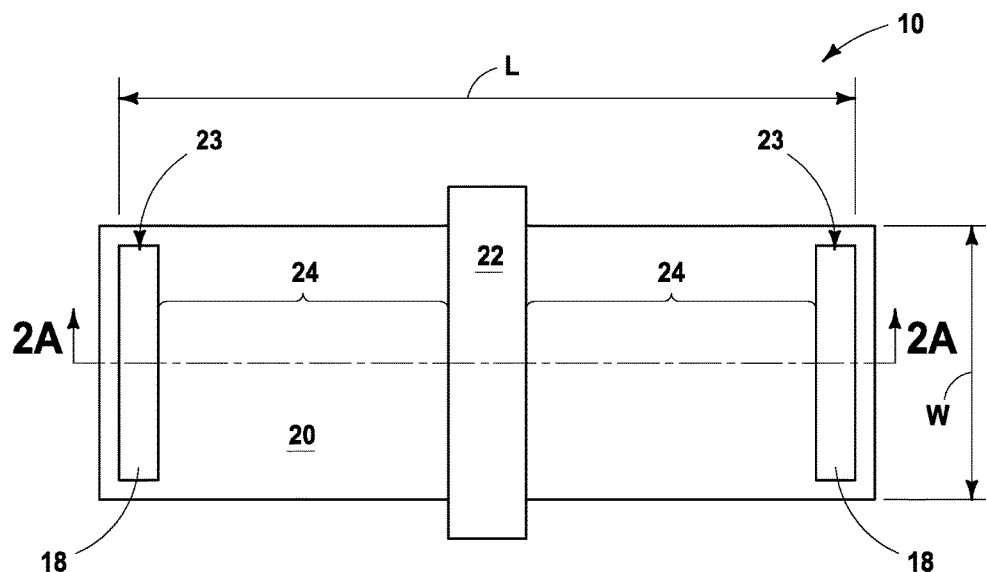
FIG. 2 is a diagrammatic top view of an example embodiment high-voltage transistor.
Figure 2A:
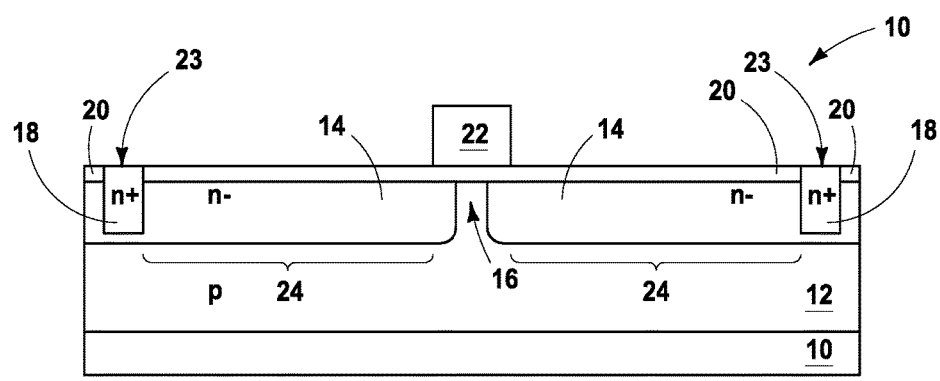
FIG. 2A is a diagrammatic cross-sectional side view along the line 2A-2A of FIG. 2.

FIGS. 2 and 2A show an example embodiment high-voltage transistor 10. The transistor comprises n-type doped LDD regions 14 extending into a p-type doped semiconductor substrate 12. The substrate 12 may comprise, consist essentially of, or consist of monocrystalline silicon in some embodiments. In the shown embodiment, the substrate is supported by an electrically insulative material 10. Such material 10 may be any suitable composition or combination of compositions, and may, for example, comprise, consist essentially of, or consist of silicon dioxide. The shown embodiment may be an example of a silicon-on-insulator (SOI) configuration. In other embodiments, other configurations may be utilized; for example, high-voltage transistors may comprise doped regions extending into bulk semiconductor material rather than in SOI constructions.

The LDD regions 14 extend between a channel region 16 and heavily-doped source/drain regions 18. In the shown embodiment, the LDD regions 14 are illustrated as being doped to an "n-" concentration and the source/drain regions 18 are illustrated as being doped to an "n+" concentration to indicate that the source/drain regions are more heavily doped than the LDD regions. Example relationships between n- and n+ dopant concentrations are described in definitions provided at the end of this section of the disclosure.

Although the illustrated transistor comprises a p-type channel, in other embodiments the illustrated dopant types may be reversed so that the transistor comprises an n-type channel, and comprises p-type LDD and source/drain regions.

Gate dielectric 20 extends across the LDD regions 14 and the channel region 16, and a gate 22 is formed over the gate dielectric. The gate dielectric may comprise any suitable composition or combination of compositions; and in some embodiments may comprise, consist essentially of, or consist of one or more of silicon dioxide, hafnium oxide, aluminum oxide, zirconium oxide, etc. The gate may comprise any suitable composition or combination of compositions; and in some embodiments may comprise, consist essentially of, or consist of one or more of various metals (for instance, tungsten, titanium, etc.), metal-containing compositions (for instance, metal nitride, metal silicide, metal carbide, etc.) and conductively-doped semiconductor materials (for instance, conductively-doped silicon, conductively-doped germanium, etc.). Although the gate dielectric is shown extending entirely across the LDD regions, in other embodiments the gate dielectric may not extend across the entirety of the LDD regions.

Contact openings 23 extend through the dielectric 20 to expose upper surfaces of source/drain regions 18, and to provide locations for electrical contact to the source/drain regions. In the shown embodiment, the contact openings extend entirely across the source/drain regions. In other embodiments (not shown) one or more smaller contact openings may be utilized to provide locations for electrical contact to the source/drain regions. If dielectric 20 does not extend entirely across the LDD regions, there may be dielectric surrounding the contact regions which may the same composition as the gate dielectric, or which may be different in composition from the gate dielectric.

In operation, an electrical state of gate 22 determines whether the LDD regions 14 are electrically coupled to one another across channel region 16. Specifically, sufficient gate voltage provides an electrical field which couples the LDD regions to one another across the channel region (i.e. the transistor is "on"), and otherwise the LDD regions are not coupled to one another across the channel region (i.e., the transistor is "off"). Such is the normal operation of transistor 10. However, if there is sufficient voltage differential between a source/drain region and the substrate or another region, then current may flow across one or more np junctions regardless of whether the transistor is in an "on" configuration or an "off" configuration. The threshold voltage differential leading to such condition is referred to as a breakdown voltage. In some applications, the breakdown voltage may correspond to a breakdown voltage between drain and source/substrate with gate/source/substrate at ground ($BV_{dss}$).

The transistor 10 may be considered to comprise active regions 24, which are regions of the LDD implants 14 between source/drain regions 18 and gate 22. Such active regions electrically couple the source/drain regions 18 to the channel region 16. In the shown embodiment, both of the active regions 24 on the opposing sides of the gate 22 have a same dopant concentration as one another. In other embodiments, such may not be the case.

The transistor 10 has a length "L" and a width "W". The length can determine the breakdown voltage of the transistor, with longer transistors having higher breakdown voltages; and the width can determine the drive current of the transistor, with wider transistors having higher drive currents. However, it is not simply length and width which determine operational characteristics of the transistor. For instance, the dopant concentration within the LDD regions 14 may also impact the operational characteristics of the transistor.

Figure 3:
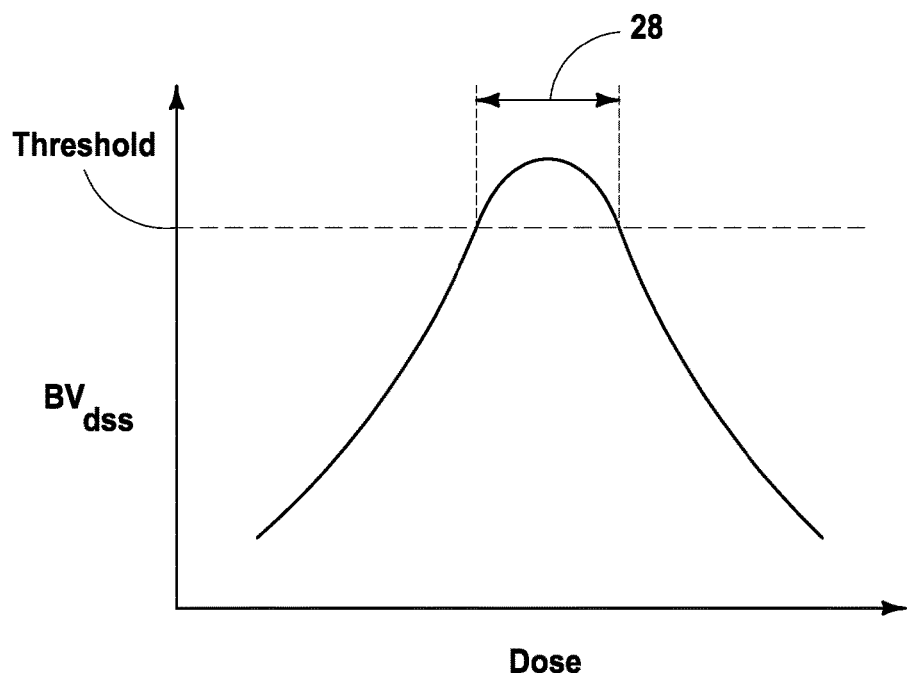
FIG. 3 is graphical illustration of an example embodiment relationship between breakdown voltage drain-source-substrate at ground ($BV_{dss}$) and active area implant dose for a high-voltage transistor.

FIG. 3 graphically illustrates an approximate relationship between breakdown voltage ($BV_{dss}$) and dopant concentration within LDD regions (shown on the graph as "dose") of an example embodiment high-voltage transistor. There is an optimum dopant concentration which achieves peak breakdown voltage, and dopant concentrations above or below such optimum concentration result in lower breakdown voltages. In some applications, it is desired that a high-voltage transistor operate within specified tolerances. A threshold breakdown voltage is shown in FIG. 3, and such threshold breakdown voltage may correspond to a lower end of the suitable tolerance for a high-voltage transistor in a particular application. The illustrated transistor will have a breakdown voltage equal to or exceeding the threshold provided that the dopant is implanted into an active region of the transistor at a dose within the illustrated window 28. The window 28 thus defines an operational characteristic of the high-voltage transistor graphically represented in FIG. 3, in that window 28 corresponds to an implant dosage range which will create a transistor having a breakdown voltage within desired tolerances.

Figure 4:
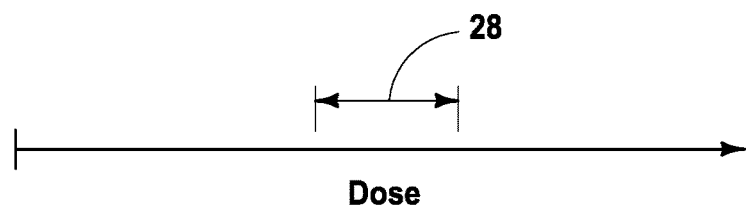
FIG. 4 is a simplified graphical illustration of a suitable dopant window for a achieving a $BV_{dss}$ within a desired range relative to the relationship shown in FIG. 3.

In some embodiments, the graph of FIG. 3 may be simplified to the graphical illustration of FIG. 4 for describing the high-voltage transistor. Specifically, the transistor may be described simply by the dose window 28.

Figure 5:
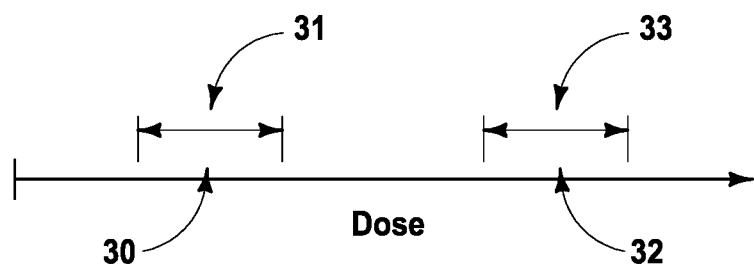
FIG. 5 is a graphical illustration of suitable dopant windows for achieving $BV_{dss}$ within desired ranges for two high-voltage transistors that are of differing widths relative to one another.

FIG. 5 graphically compares two different high-voltage transistors 30 and 32, with the transistors being characterized by dose windows 31 and 33, respectively. The transistor 30 may correspond to a relatively wide transistor having a relatively high drive current, and the transistor 32 may correspond to a relatively narrow transistor having a relatively low drive current. The terms relatively wide and relatively narrow are utilized in relation to one another to indicate that the relatively wide transistor is wider than the relatively narrow transistor; and similarly the terms relatively high drive current and relatively low drive current are utilized in relation to one another to indicate that the relatively high drive current is higher than the relatively low drive current. A problem with the transistors 30 and 32 of FIG. 5 is that the windows 31 and 33 do not overlap one another, and accordingly there is no single implant dose which may be utilized for achieving desired breakdown voltages of both of the transistors 30 and 32. Thus, transistor 30 requires a different active area implant than transistor 32 in order to have both of the transistors 30 and 32 formed within operational tolerances.

Figure 6:
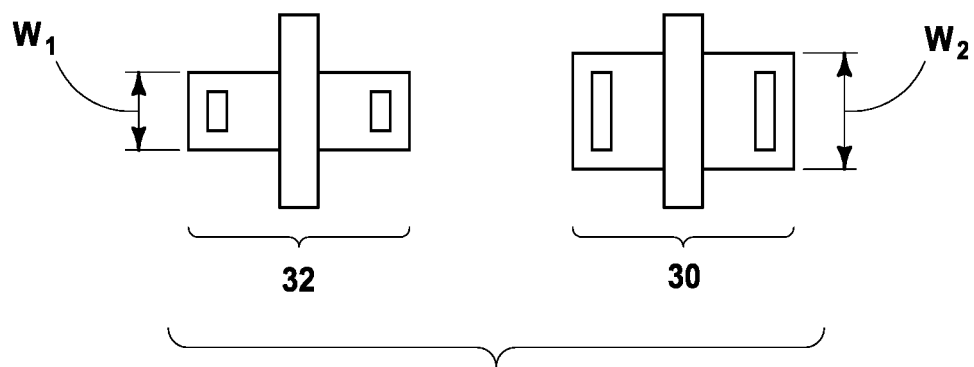
FIG. 6 is a diagrammatic top view of a portion of an example embodiment integrated circuit region comprising two high-voltage transistors that are of differing widths relative to one another.

FIG. 6 diagrammatically illustrates example high-voltage transistors 30 and 32. Such transistors are similar to the transistor 10 of FIG. 2. The transistors 30 and 32 differ from one another in that transistor 30 is wider than transistor 32. Specifically, transistor 32 has a width "$W_1$", and transistor 30 has a width "$W_2$" which is greater than "$W_1$".

Figure 7:
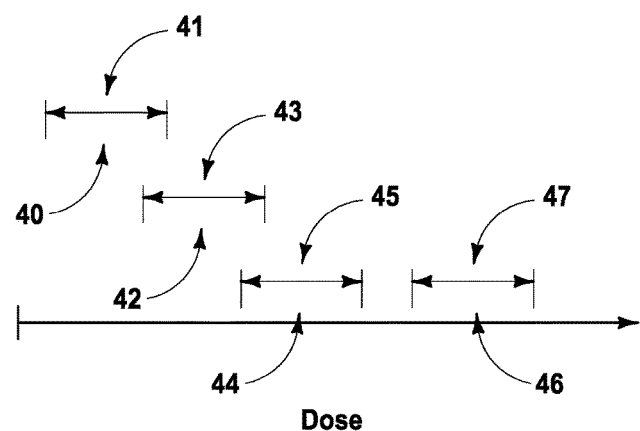
FIG. 7 is a graphical illustration of suitable dopant windows for achieving $BV_{dss}$ within desired ranges for four high-voltage transistors that are of differing widths relative to one another.

FIG. 7 graphically illustrates a more complicated situation than that of FIG. 5. Specifically, FIG. 7 illustrates a configuration comprising four transistors 40, 42, 44 and 46, with the transistors being characterized by dose windows 41, 43, 45 and 47, respectively. In some embodiments, the transistors may become increasingly narrow in progressing from transistor 40 to transistor 46. Although there is some overlap between some of the dose windows (for instance, dose window 41 overlaps dose window 43) there is no single implant dose which may be utilized for achieving desired breakdown voltages of all of the transistors 40, 42, 44 and 46.

Figure 8:
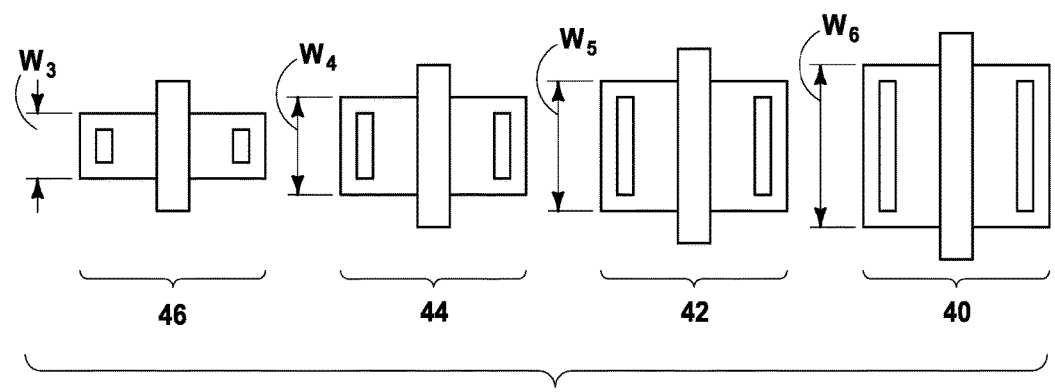
FIG. 8 is a diagrammatic top view of a portion of an example embodiment integrated circuit region comprising four high-voltage transistors that are of differing widths relative to one another.

FIG. 8 diagrammatically illustrates example high-voltage transistors 40, 42, 44 and 46. The transistors differ from one another in width. Specifically, transistor 46 has a width "$W_3$", transistor 44 has a width "$W_4$", transistor 42 has a width "$W_5$", and transistor 40 has a width "$W_6$"; with "$W_6$" being greater than "$W_5$", which is greater than "$W_4$", which in turn is greater than "$W_3$".

Some embodiments include methods of shifting dose-response characteristics of relatively wide high voltage transistors so that desired breakdown characteristics of such relatively wide transistors may be achieved utilizing the same active area dopant concentration utilized for relatively narrow transistors; and accordingly so that the relatively wide transistors and relatively narrow transistors may be simultaneously doped with a single implant. For instance, an active area of a first transistor may be formed, and an active area of a second transistor may be formed. The active area of the first transistor may wider than the active area of the second transistor. Dielectric features may be formed in the active area of the first transistor so that the active area of the first transistor is broken up to a different extent than the active area of the second transistor. The active area of the first transistor and the active area of the second transistor may then be doped with a same dopant concentration. In some embodiments, the active areas of the first and second transistors may be simultaneously doped with a single implant.

Figure 9:
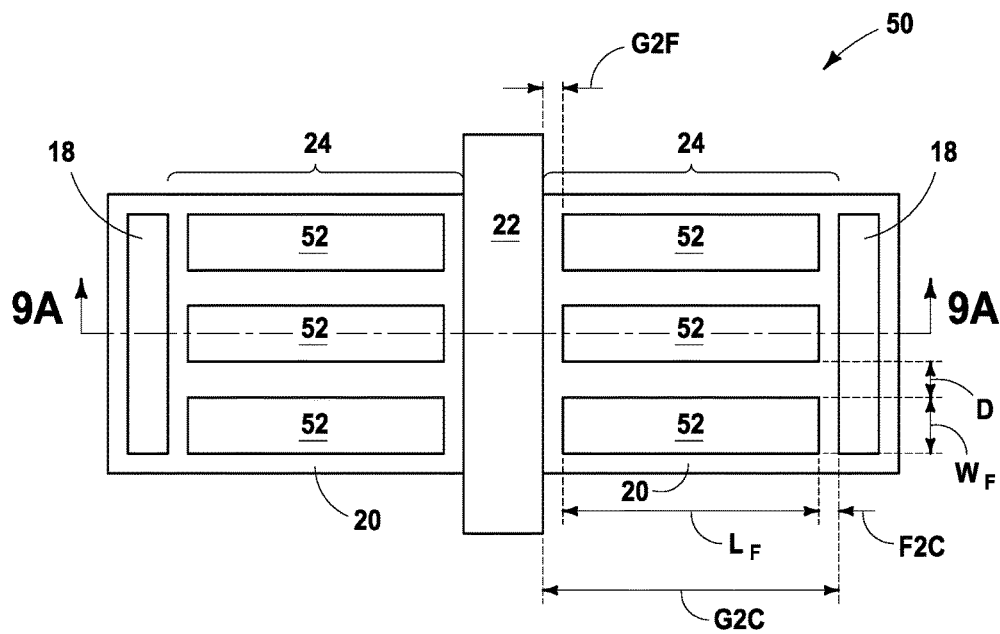
FIG. 9 is a diagrammatic top view of an example embodiment high-voltage transistor modified with dielectric features within an active area of the device.
Figure 9A:
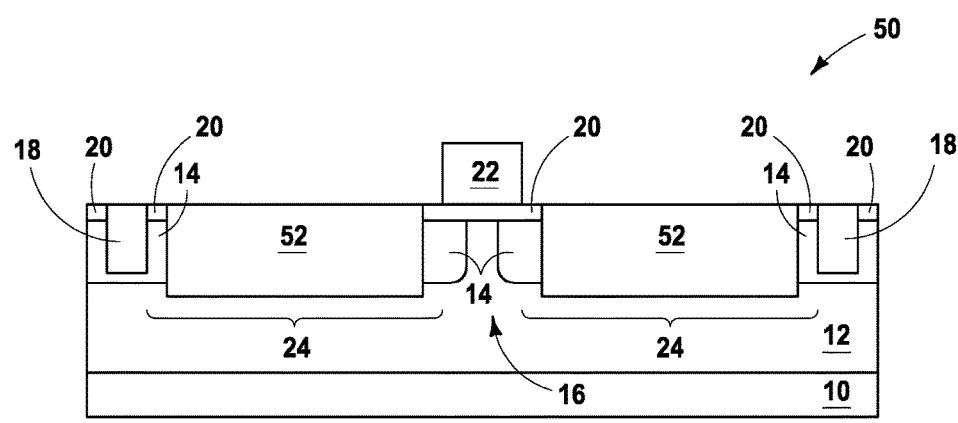
FIG. 9A is a diagrammatic cross-sectional side view along the line 9A-9A of FIG. 9.

FIGS. 9 and 9A show an example embodiment high-voltage transistor 50 which has been modified to shift its dose-response characteristics. Similar numbering will be utilized to describe modified transistor 50 of FIGS. 9 and 9A as is used above to describe the transistor 10 of FIGS. 2 and 2A, where appropriate. Modified transistor 50 of FIGS. 9 and 9A differs from the transistor 10 of FIGS. 2 and 2A in that modified transistor 50 has dielectric features 52 incorporated into active areas 24. The features 52 may comprise any suitable dielectric material, and in some embodiments may comprise identical materials as are utilized in shallow trench isolation (for instance, may comprise one or more of silicon dioxide, silicon nitride, etc.) Although the illustrated dielectric features are long and thin (and specifically are rectangular), in other embodiments, the dielectric features may have other shapes including, for example, square and/or other polygonal, circular, oval, elliptical and/or other curved, etc. Also, although all of the dielectric features 52 are shown being substantially identical to one another, in other embodiments some of the dielectric features may have other shapes than others of the dielectric features.

The dielectric features 52 extend through LDD regions 14, and thus break up the active areas 24. The dielectric features shift dopant-response characteristics of device 50 relative to device 10 (FIGS. 2 and 2A) while substantially maintaining drive current characteristics. In some embodiments, the shift of the dopant response characteristics may be related to geometries and spacings of the dielectric features. Specifically, device 50 is shown to have a gate-to-contact dimension (G2C), and features 52 are shown to have lengths ($L_F$) which extend partially across the gate-to-contact dimension. A distance from the gate to ends of the features has a gate-to-feature dimension (G2F), and a distance from ends of the features to the contact has a feature-to-contact dimension (F2C). The features have widths ($W_F$) and are spaced from one another by distances D. The amount of shift of the dopant-response characteristics of transistor 50 may be related to the ratio $W_F/D$, and to $L_F$; and in some embodiments may be approximately proportional to combined effects of these two characteristics of the modified transistor.

The relationship of the amount of shift of dopant response characteristics of modified transistor 50 to various geometrical aspects of the modified transistor is provided to assist the reader in understanding this invention, and is not to limit the invention except to the extent, if any, that such relationship is explicitly claimed in the claims which follow. In practice, the amount of shift of dopant-response characteristics of a transistor modified with dielectric features analogous to those shown in FIGS. 9 and 9A may be determined through any suitable procedure, including, for example, through one or both of experimentation and theoretical calculation.

Figure 10:
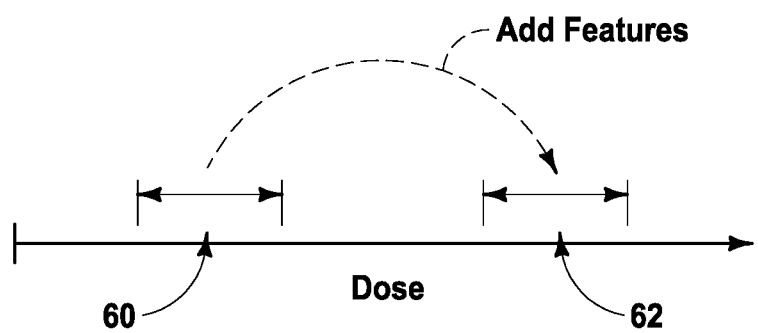
FIG. 10 is a graphical illustration of an example embodiment effect of the modification of FIG. 9 on a suitable dopant window for achieving $BV_{dss}$ within a desired range for a high-voltage transistor.

Features analogous to the features 52 of FIGS. 9 and 9A may be utilized to shift dopant response characteristics of relatively wide high-voltage transistors so that such relatively wide transistors may be effectively doped with a same dopant concentration as is utilized for doping relatively narrow high-voltage transistors. FIG. 10 graphically illustrates an effect of features analogous to the features 52 of FIGS. 9 and 9A, and shows two dopant response profiles 60 and 62. The profile 60 shows dopant levels suitable to achieve desired breakdown voltage characteristics of a transistor of a given width, and profile 62 shows dopant levels suitable to achieve the same breakdown voltage characteristics of the same transistor after addition of features analogous to the features 52 of FIGS. 9 and 9A.

Figure 11:
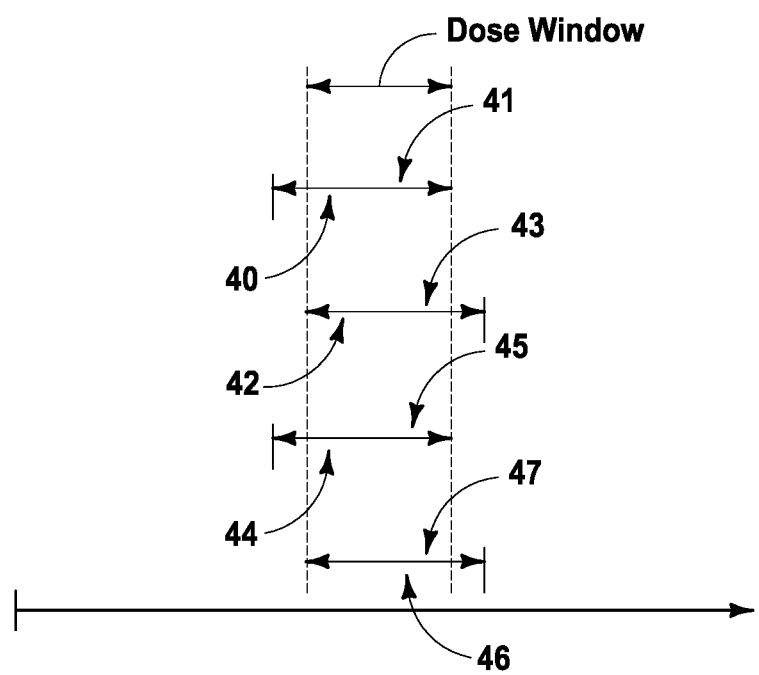
FIG. 11 is a graphical illustration of suitable dopant windows for achieving $BV_{dss}$ within desired ranges for four high-voltage transistors that are of differing widths relative to one another after modification of some of the devices with dielectric features analogous to those shown in FIG. 9.

An application for dielectric features analogous to the dielectric features 52 of FIGS. 9 and 9A is described with reference to FIGS. 11 and 12. Specifically, FIGS. 11 and 12 describe the same transistors 40, 42, 44 and 46 described above with reference to FIGS. 7 and 8, but after dopant response characteristics of transistors 40, 42 and 44 have been modified with dielectric features 52. The spacings and/or shapes of the dielectric features are different in the wider transistors as compared to the narrower transistors so that all of the windows 41, 43, 45 and 47 of suitable implant doses overlap one another. Accordingly, there is now a single dose window which can be utilized for providing suitable implant to all of the high-voltage transistor devices such that all have breakdown voltages within desired tolerances.

Figure 12:
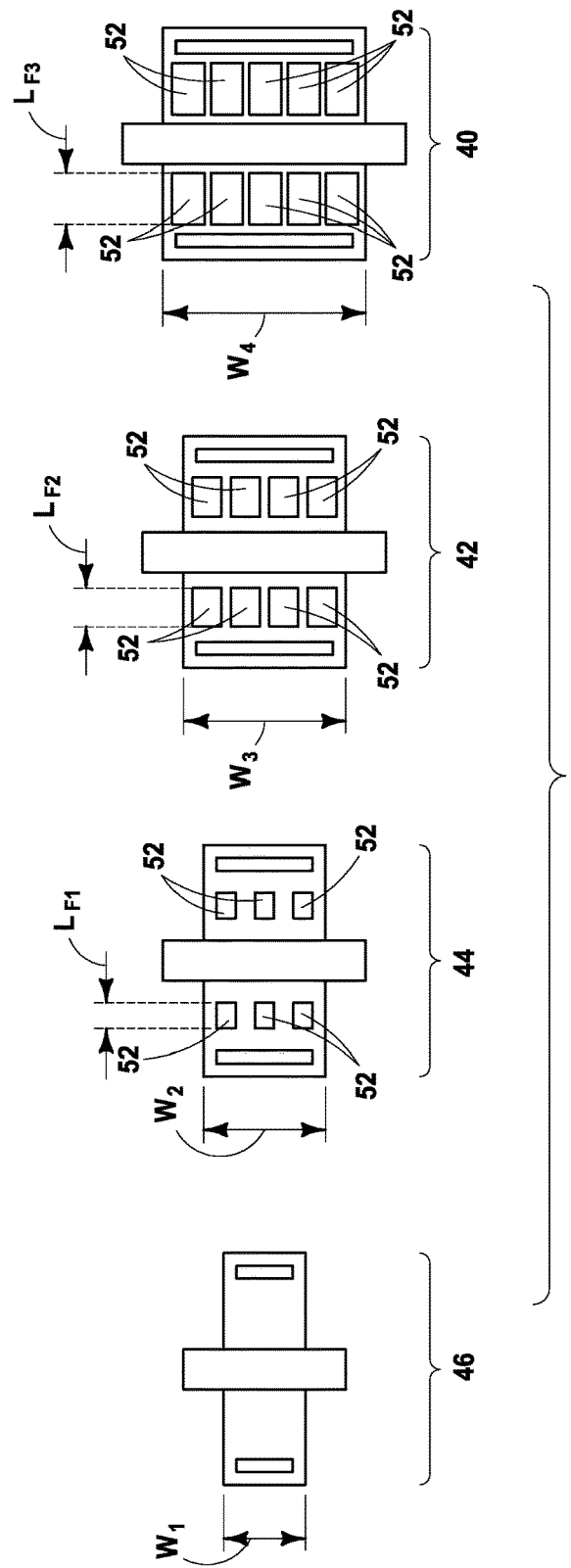
FIG. 12 is a diagrammatic top view of a portion of an example embodiment integrated circuit region comprising four high-voltage transistors that are of differing widths relative to one another; with various of the high-voltage transistors comprising dielectric features within active areas of the devices.

FIG. 12 shows that dielectric features 52 are provided to break up the active regions within all of the high-voltage transistors 40, 42 and 44. The amount to which the various active regions are broken up differs depending on the widths of the transistors. For instance, transistors 42 and 44 may be considered to be first and second high-voltage transistors, respectively, having first and second active regions, respectively. The first and second active regions of the first and second transistors 42 and 44 are each broken up by dielectric features 52, but the second active region (i.e., the narrower active region) is broken up to a lesser extent than the first active region (i.e., the wider active region). As another example, high-voltage transistors 44 and 46 may be considered to be first and second transistors, respectively having first and second active regions, respectively. In this case, only the first active region of transistor 44 is broken up by dielectric features 52. In some embodiments, the transistors 46, 44, 42 and 40 may be considered to be first, second, third and fourth transistors, respectively, which are increasingly wider relative to one another, and which have increasingly more broken up active regions relative to one another in order that all may have overlapping dose windows for achieving desired breakdown voltages. In some embodiments, the dielectric features 52 within transistors 44, 42 and 40 may become increasingly longer, such that $L_{F1} < L_{F2} < L_{F3}$.

The formation of transistors 40, 42, and 44 may comprise conventional methodology as formation of transistor 46, with additional steps of determining locations of active areas of wider high-voltage transistors where modification is desired to shift dopant response of the transistors, and of making such modifications. After the appropriate modifications are made to the wider transistors (such as addition of dielectric features 52 or analogous dielectric features), a same active area dopant concentration may achieve desired breakdown characteristics of all of the transistor 40, 42, 44 and 46 (i.e., the same implant will appropriately dope wider high-voltage transistors and narrower high-voltage transistors). Thus, in some embodiments an active area dopant may be simultaneously implanted into active areas of all of the high-voltage transistors 40, 42, 44 and 46 to achieve desired breakdown characteristics of all of the transistors.

Figure 13:
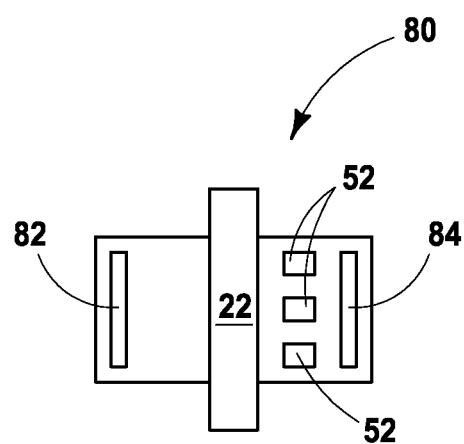
FIG. 13 is a diagrammatic top view of another example embodiment high-voltage transistor modified with dielectric features within an active area of the device.

The illustrated modified transistors of FIGS. 9 and 12 have the dielectric features 52 uniformly distributed on both sides of gate 22 so that the dielectric features on one side of the gate are a mirror image of the dielectric features on the other side of the gate. In other embodiments, the dielectric features may be asymmetrically distributed relative to the gate. For instance, in some embodiments one of the source/drain regions 18 carries high-voltage in an off-state of the transistor device, and the other does not. For instance, one of the source/drain regions may be a drain region which carries high-voltage in an off-state and the other may be a source region which does not carry high high-voltage in the off-state. In such embodiments, the dielectric features 52 may be arranged to be primarily between the gate and the source/drain region which carries high-voltage in an off-state of the transistor device. FIG. 13 shows an example embodiment high-voltage transistor 80 having a source region 82 and a drain region 84, and having the dielectric features 52 within the active region between the gate 22 and the drain region 84, and not within the active region between the gate 22 and the source region 82. In other embodiments, there may be some dielectric features between the gate 22 and the source region 82, but fewer than between the gate 22 and the drain region 84.

The high-voltage transistors described herein may be utilized in integrated circuitry, and in some embodiments may be utilized for controlling electrical flow to logic and/or memory. For instance, in some embodiments the high-voltage transistors may be electrically coupled to a flash memory array (for instance, a NAND array) and utilized for controlling electrical flow during block erase operations of the flash memory and/or other programming operations of the flash memory.

Although dielectric features are shown in the accompanying figures as being utilized in high-voltage transistors, in some embodiments analogous dielectric features may be utilized in other transistors, which may or may not be high voltage transistors.

The electronic devices described herein may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, clocks, televisions, cell phones, personal computers, automobiles, industrial control systems, aircraft, etc.

The terms "dielectric" and "electrically insulative" are both utilized to describe materials having insulative electrical properties. Both terms are considered synonymous in this disclosure. The utilization of the term "dielectric" in some instances, and the term "electrically insulative" in other instances, is to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some of the figures show various different dopant levels, and utilize some or all of the designations p+, p, p−, n−, n and n+ to distinguish the levels. The difference in dopant concentration between the regions identified as being p+, p, and p− are typically as follows. A p+ region has a dopant concentration of at least about $10^{20}$ atoms/cm$^3$, a p region has a dopant concentration of from about $10^{14}$ to about $10^{18}$ atoms/cm$^3$, and a p− region has a dopant concentration in the order of or less than $10^{16}$ atoms/cm$^3$. It is noted that regions identified as being n−, n and n+ will have dopant concentrations similar to those described above relative to the p−, p and p+ regions respectively, except, of course, the n regions will have an opposite-type conductivity enhancing dopant therein than do the p regions. It is noted that the terms "p" and "n" can be utilized herein to refer to both dopant type and relative dopant concentrations. The terms "p" and "n" are to be understood as referring only to dopant type, and not to a relative dopant concentration, except when it is explicitly stated that the terms refer to relative dopant concentrations. Accordingly, for purposes of interpreting this disclosure and the claims that follow, it is to be understood that the term "p− type doped" and "n-type doped" refer to dopant types of a region and not to relative dopant levels. Thus, a p-type doped region can be doped to any of the p+, p, and p− dopant levels discussed above, and similarly an n-type doped region can be doped to any of the n+, n, and n− dopant levels discussed above.

Some embodiments include integrated circuits having first and second transistors. The first transistor is wider than the second transistor. The first and second transistors have first and second active regions, respectively. Dielectric features are associated with the first active region and break up the first active region. The second active region is not broken up to the same extent as the first active region.

Some embodiments include methods of forming transistors of different widths. An active area of a first transistor is formed. An active area of a second transistor is formed, where the active area of the first transistor is wider than the active area of the second transistor. Dielectric features are formed in the active area of the first transistor, where the active area of the first transistor is broken up to a different extent than the active area of the second transistor. The active area of the first transistor and the active area of the second transistor are doped with a same dopant concentration.

Some embodiments include methods of forming transistors of different widths. An active area of a first transistor is formed. An active area of a second transistor is formed, where the active area of the first transistor is wider than the active area of the second transistor. Dielectric features are formed in the active area of the first transistor, where the active area of the first transistor is broken up to a different extent than the active area of the second transistor. The active area of the first transistor and the active area of the second transistor are simultaneously doped with a single implant.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A method of forming transistors, comprising:
   forming an active area of a first transistor, the first transistor comprising a gate and source/drain regions;
   forming an active area of a second transistor, the second transistor comprising a gate and source/drain regions, wherein a length dimension for first and second transistors is defined in a direction along a dimension of spacing distance between respective source/drain regions of each transistor and a width dimension is perpendicular to the length dimension, where the active area of the first transistor is wider (in the direction of the width dimension) than the active area of the second transistor;
   forming first dielectric features in the active area of the first transistor to break up the active area of the first transistor to a first extent, the first dielectric features are spaced, in the direction of the length dimension, from the gate and the source/drain regions in the active area of the first transistor;
   forming second dielectric features in the active area of the second transistor to break up the active area of the second transistor to a second extent which is different than the first extent; the first and second dielectric features comprising a same composition; and
   after forming the first and second dielectric features, doping the active area of the first transistor and the active area of the second transistor with a same dopant concentration.

2. The method of claim 1 wherein the first dielectric features are two or more features with length greater than width.

3. The method of claim 2 wherein the source/drain region is a drain region.

4. The method of claim 1 wherein the first dielectric features are arranged on both sides of a gate of said first transistor, with the first dielectric features on one side of the gate being a mirror image of the first dielectric features on an opposing side of the gate.

5. The method of claim 1 wherein the first dielectric features are not symmetrically distributed on one side of the gate relative to another side of the gate.

6. The method of claim 1 wherein the first and second transistors are high-voltage transistors.

7. The method of claim 6 wherein a memory array is formed proximate the high-voltage transistors and is electrically coupled with the high-voltage transistors.

8. The method of claim 7 wherein the memory array comprises flash memory devices, and further comprising utilizing the high-voltage transistors during a block erase of the flash memory devices.

9. The method of claim 1 wherein the second dielectric features are spaced, in the direction of the length dimension, from the gate and the source/drain regions in the active area of the second transistor.

10. The method of claim 1 wherein at least one of the first dielectric features are shaped, in the plan view (horizontal plane), in at least one of the following shapes: square, circular, oval, elliptical and/or curved.

11. The method of claim 1 wherein the first dielectric features are rectangularly shaped with the greater dimension of the rectangular shape being in the direction of the length dimension of the first transistor.

12. The method of claim 1 wherein the first dielectric features are rectangularly shaped and the gate is rectangularly shaped, the greater dimensions of respective rectangular shapes are perpendicular relative to each other.

13. The method of claim 1 wherein at least two of the first dielectric features are differently shaped relative to each other.

14. The method of claim 1 wherein the first dielectric features are configured as a first shape, wherein the second dielectric features are configured as a second shape, the first shape and the second shape are different shapes.

15. The method of claim 1 wherein a spacing between at least two of the first dielectric features comprises a first dimension, wherein a spacing between at least two of the second dielectric features comprises a second dimension, the first dimension and the second dimension are different dimensions.

16. The method of claim 1 wherein the active area of the first transistor is broken up to a first degree by the first dielectric features, wherein the active area of the second transistor is broken up to a second degree by the second dielectric features, the first degree and the second degree are different degrees.

* * * * *

UNITED STATES PATENT AND TRADEMARK OFFICE
CERTIFICATE OF CORRECTION

PATENT NO. : 10,020,228 B2  
APPLICATION NO. : 15/357602  
DATED : July 10, 2018  
INVENTOR(S) : Michael A. Smith Page 1 of 1

It is certified that error appears in the above-identified patent and that said Letters Patent is hereby corrected as shown below:

On the Title Page

Item (60) Related to U.S. Application Data:  
Replace:  
"Division of application No. 14/966,927, filed on Dec. 11, 2015, now Pat. No. 9,530,837, which is a continuation of application No. 14/702,571, filed on May 1, 2015, now Pat. No. 9,236,307, which is a division of application No. 13/897,047, filed on May 17, 2013, now Pat. No. 9,041,144."

With:  
--Division of application No. 14/966,927, filed on Dec. 11, 2015, now Pat. No. 9,530,837, which is a division of application No. 14/702,571, filed on May 1, 2015, now Pat. No. 9,236,307, which is a division of application No. 13/897,047, filed on May 17, 2013, now Pat. No. 9,041,144.--

Signed and Sealed this  
Twenty-first Day of May, 2019

Andrei Iancu  
*Director of the United States Patent and Trademark Office*